United States Patent
Chen

(10) Patent No.: US 6,251,727 B1
(45) Date of Patent: Jun. 26, 2001

(54) METHOD OF MAKING SELECT GATE SELF-ALIGNED TO FLOATING FOR SPLIT GATE FLASH MEMORY STRUCTURE

(75) Inventor: Bin-Shing Chen, Hsinchu (TW)

(73) Assignee: Winbond Electronics Corp, Hsinchu (TW)

(*) Notice: Subject to any disclaimer, the term of this patent is extended or adjusted under 35 U.S.C. 154(b) by 0 days.

(21) Appl. No.: 09/200,911

(22) Filed: Nov. 27, 1998

(51) Int. Cl.⁷ .................................................. H01L 21/336
(52) U.S. Cl. ........................ 438/257; 438/261; 438/263; 438/264
(58) Field of Search .................................. 438/142, 201, 438/257, 263, 264, 261

(56) References Cited

U.S. PATENT DOCUMENTS

| | | | |
|---|---|---|---|
| 5,940,706 | * | 8/1999 | Sung et al. .......................... 438/261 |
| 6,071,777 | * | 6/2000 | Chen ..................................... 438/257 |

* cited by examiner

Primary Examiner—Matthew Smith
Assistant Examiner—V. Yevsikov
(74) Attorney, Agent, or Firm—W. Wayne Liauh

(57) ABSTRACT

A process for making self-aligned split-gate non-volatile memory cell is disclosed. It includes the step of using a nitride photomask in conjunction with a photoresist to etch the nitride layer and cause it to become a stepped nitride layer having a high thickness region and a low thickness. Then a poly-1 photomask is used in conjunction with a photoresist to etch through a first portion of the low thickness region to expose an underlying poly-1 layer intended to be floating gate, wherein at the same time, a portion of the high thickness region adjacent to the first portion of the low thickness region is also etched to a reduced thickness. After poly-1 oxidation, a cell drain photomask is used in conjunction with a photoresist to etch through a second portion of the low thickness region using a nitride etch and an underlying poly-1 layer using a poly etch. The portion of the high thickness region adjacent to the second portion of the low thickness region is also etched to a reduced thickness during the nitride etch. With such a stepped nitride layer approach, the floating gate and cell drain are formed using the same nitride photomask, thus ensuring the self-alignment of the select gate relative to the floating gate and the cell drain.

10 Claims, 4 Drawing Sheets

METHOD OF MAKING SELECT GATE SELF-ALIGNED TO FLOATING FOR SPLIT GATE FLASH MEMORY STRUCTURE

FIELD OF THE INVENTION

The present invention relates to an improved method for making split-gate non-volatile memory (NVM). More specifically, the present invention relates to an improved method for making split-gate type non-volatile memory cells wherein the select gate is self-aligned relative to the floating gate, so as to eliminate the misalignment problems, while allowing a further down-scaling of the memory cells without the need to incur large capital expenses for upgrading existing photolithography equipment.

BACKGROUND OF THE INVENTION

Due to their relatively small dimension, non-volatile memory cells, or non-volatile electrically alterable semiconductor memory derives, are well-known in the art and have become an important everyday consumers item. Typically, electrical alterability is achieved by the so-called Fowler-Nordheim tunneling of charges between a floating gate (i.e., without connecting to any conductive element) and the silicon substrate through a very thin dielectric. Each storage cell requires a floating gate and a select gate. The degree of misalignment of the select gate relative to the floating gate is one of the major factors that can significantly and adversely affect the performance of a split gate non-volatile memory cell. A non-self-alignment split-gate process must take the alignment tolerance into consideration. If the degree of misalignment exceeds the alignment tolerance, many undesirable cell characteristics can surface. Some of the typical problems include unsatisfactory program efficiency, assymmetric cell current, poor immunity to drain disturb during programming, etc.

U.S. Pat. No. 5,280,446 provides a concise background information about the conventional "stacked"-type flash EPROM device and the problems associated therewith. The flash memory cell circuit disclosed in the '446 patent comprises a plurality of memory elements in a matrix fashion with each element including a semiconductor substrate, a drain region, a source region, a floating gate, a control gate, and a select gate. A special arrangement on the memory array is provided such that the programming of the memory cell is achieved by high efficient hot electron injection which allows lower drain voltage during programming, so as to achieve low voltage power supply operation capability.

U.S. Pat. Nos. 5,029,130, 5,045,488, and 5,067,108 disclose a single transistor electrically programmable and erasable memory cell having a source, a drain with a channel region therebetween, defined on a substrate. A first insulating layer is provided over the source, channel and drain regions, and a floating gate is positioned on top of the channel region and over a portion of the drain region. A second insulating layer is provided which has a top wall over the floating gate and a side wall adjacent thereto. A control gate has a first portion over the first insulating layer and a second portion over the top wall of the second insulating layer and over the floating gate. The control gate is not self-aligned to the floating gate, and many misalignment problems can be experienced.

U.S. Pat. No. 5,674,767 discloses a method of manufacturing a nonvolatile memory device having a self-aligned structure. The flash memory device has a split gate structure, and the method includes the steps of forming a gate insulating film on a semiconductor substrate. A semiconductor layer is formed on the gate insulating film and etched to form floating gates and a semiconductor pattern between the floating gates. Impurity ions are implanted into the same side of the substrate as the floating is formed, to form a drain region. A planarizing film is deposited on the substrate and etched until the upper surfaces of the floating gates and the semiconductor pattern are exposed. The semiconductor pattern is removed and impurity ions are implanted into the substrate to form a source region. The planarizing film is removed to expose the floating gate, and a dielectric film is formed thereon. Finally, a control gate is formed on the substrate. The method disclosed in the '767 patent provides a means for self-alignment of the floating gate with respect to the source/drain impurity regions, misalignment problems still exist between the control gate and the floating gate.

U.S. Pat. No. 5,330,938 discloses a method of making non-volatile split gate EPROM memory cell and self-aligned field insulation. The memory cell comprises a substrate with diffusion of source and drain separated by a channel area, a floating gate superimposed over a first part of the channel area and a control gate formed by first and a second polysilicon strip, respectively, a cell gate oxide between the floating gate and the first part of the channel area, an interpoly oxide between the floating gate and the control gate, and a layer of dielectric film. The floating gate is aligned with the drain diffusion, and the control gate is aligned with the floating gate and with the diffusion of source and drain. However, the method disclosed in the '938 is relatively complicated for implementation and can significantly increase manufacturing cost, and is inapplicable when the control gate has a peripheral length that extends beyond the floating gate.

SUMMARY OF THE INVENTION

The primary object of the present invention is to develop a non-volatile memory cell with minimized misalignment between the select gate and the floating gate. More specifically, the primary object of the present invention is to develop an improved method for making split-gate type non-volatile memory cells wherein the select gate is self-aligned relative to the floating gate, so as to eliminate the misalignment problems, while allowing a further down-scaling of the memory cells without the need to incur large capital expenses for upgrading existing photolithography equipment.

The method disclosed in the present invention can be summarized as generally comprising the following steps:

(1) Forming a tunnel oxide on a substrate.

(2) Depositing a poly-1 layer (i.e, the first polysilicon layer) on the tunnel oxide layer followed by doping.

(3) Depositing a nitride layer on the poly-1 layer.

(4) Depositing and developing a nitride photoresist using a nitride photomask which exposes areas intended to encompass floating gate and cell drain.

(5) Applying a first nitride etching to partially etch the nitride layer, then removing the nitride photoresist.

(6) Depositing and developing a poly-1 photoresist using a poly-1 photomask which exposes the previously etched nitride layer and a predetermined portion of the un-etched nitride layer adjacent thereto.

(7) Applying a second nitride etching to further etch the previously etched nitride layer and the adjacent un-etched nitride layer until the portion of the poly-1 layer underlying the etched nitride layer is exposed, then removing the photoresist.

(8) Using the nitride layer as a mask to cause oxidation in the poly-1 layer and form a poly-oxide layer. It should be noted that with the stepped nitride layer construction of the present invention, the cell drain portion has already been marked, or self-aligned, when the entire nitride layer is utilized as the mask during poly-1 oxidation.

(9) Depositing and developing a cell drain photoresist using a cell-drain photomask, followed by a third nitride etching, a poly-1 etching, drain implantation, and removal of photoresist.

(10) Optionally, a drain oxidation step can be applied before the photoresist removal to increase the oxide layer thickness above the drain.

(11) Removing the nitride layer using hot $H_3PO_4$ or wet etch.

(12) Etching the poly-1 layer using the poly-oxide layer as a hard mask.

(13) Forming a sidewall dielectric layer around the remaining poly-1 layer by dielectric deposition or dielectric growth.

(14) Depositing a poly-2 layer (i.e, the second polipilicon layer) on the wafer followed by doping.

(15) Depositing and developing a poly-2 photoresist using a poly-2 photomask which will cover the portion of the poly-2 layer intended to be select gate, followed by etching the poly-2 layer and photoresist removal. And

(16) Depositing and developing a cell source photoresist using a cell-source photomask, followed by source implantation, and removal of photoresist.

One of the key elements of the method disclosed in the present invention is to use the first nitride photomask to etch half of the nitride layer, and then utilize the nitride layer having a stepped-thickness configuration as an etching stop for the underlying poly-1 layer. In other words, the stepped nitride layer defines both the floating gate and the cell drain. As a result, the length of the select gate is pre-determined by the nitride photomask. With this self-aligned feature, the split-gate non-volatile memory cell of the present invention will exhibit better symmetry characteristics and improved performance. The self-alignment feature also allows the split-gate memory structure to be further scaled down without incurring large expenses which will be required to upgrade the photolithography process and equipment.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
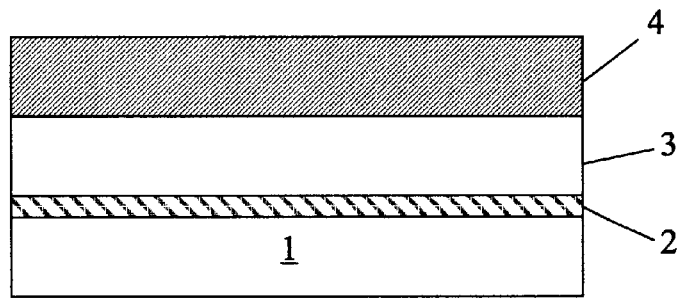
FIG. 1 is a schematic diagram showing a wafer containing a nitride layer, a poly-1 layer and a tunnel oxide layer formed on a substrate.

The present invention discloses an improved method for making split-gate type non-volatile memory cells wherein the select gate is self-aligned relative to the floating gate, which is self-aligned to the cell drain, so as to eliminate the misalignment problems, while allowing a further downscaling of the memory cells without the need to incur large capital expenses for upgrading existing photolithography equipment. One of the key elements of the method disclosed in the present invention is to photolithographically form a stepped nitride layer the poly-1 layer. The stepped nitride layer contains a recessed portion which will be etched in a subsequent photolithography process to expose its underlying poly-1 layer, which eventually becomes the floating gate. The same stepped nitride layer is further utilized to form the cell drain.

Therefore, in the process of the present invention, the same nitride photomask defines both the floating gate and the cell drain. As a result, the length of the select gate is pre-determined by the nitride photomask. With this self-aligned feature, the split-gate non-volatile memory cell of the present invention will exhibit better symmetry characteristics and improved performance. The self-alignment feature also allows the split-gate memory structure to be further scaled down without incurring large expenses which will be required to upgrade the photolithography process and equipment.

The process disclosed in the present invention comprises the following main steps:

(1) forming a tunnel oxide layer, a poly-1 layer, and a nitride ($Si_3N_4$) layer on a silicon substrate;

(2) using a nitride photomask in conjunction with a photoresist to cause the nitride layer to become a stepped nitride layer having a high thickness region and a low thickness;

(3) using a poly-1 photomask in conjunction with a photoresist to etch through a first portion of the low thickness region to expose an underlying poly-1 layer intended to be floating gate, at the same time, the portion of the high thickness region adjacent to the low thickness region is also etched to a reduced thickness;

(4) poly-oxidizing the exposed poly-1 layer to form a poly-oxide layer;

(5) using a cell drain photomask in conjunction with a photoresist to etch through a second portion of the low thickness region using a nitride etch and the underlying poly-1 layer using a poly etch, the portion of the high thickness region adjacent to the low thickness region is also etched to a reduced thickness during the nitride etch;

(6) performing drain implantation;

(7) removing the nitride layer;

(8) using the poly-oxide layer as a hard mask to etch the poly-1 layer;

(9) forming a sidewall dielectric layer around the remaining poly-1 layer;

(10) depositing a poly-2 layer covering the substrate;

(11) using a poly-2 photomask in conjunction with a photoresist to etch the poly-2 layer;

(12) using a cell source photomask in conjunction with a photoresist to perform cell source implantation.

To improve clarity, many obvious and common steps are omitted from the above description. These include the initial well formation, field oxide (FOX) growth, doping for the polysilicon layers, removal of photoresist after the completion of the photolithography process, etc. These steps are well known in the art, and are not explicitly discussed. However, one of the key elements of the present invention is the formation of the stepped nitride, wherein the high thickness portion will serve as an etch stop during the subsequent nitride etching step. This allows the formation of the floating gate and the cell drain with the same nitride photomask, and ensures the alignment of select gate relative to the floating gate and the peripheral length of the select gate.

The present invention will now be described more specifically with reference to the following example. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1–11 are schematic diagrams showing the main steps of the process for preparing a self-aligned split gate non-volatile memory cell of the present invention. These figures are discussed in more detail below.

FIG. 1 shows that a wafer containing a nitride ($Si_3N_4$) layer 4, a poly-1 (polysilicon) layer 3 and a tunnel oxide layer 2 are formed on a substrate 1. Preferably, the thickness of the tunnel oxide layer is formed by tunneling oxide growth and has a thickness of about 50 to 150Å. Also preferably, the poly-1 layer and the nitride layer have thicknesses of 500 to 3,000 and 300 to 3,000 Å, respectively.

Figure 2:
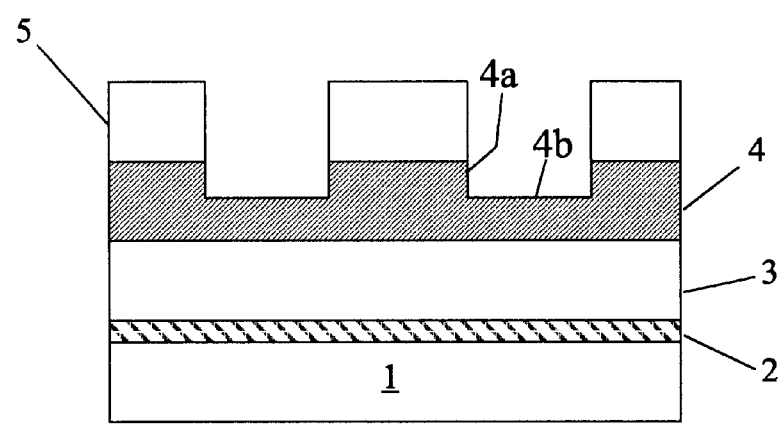
FIG. 2 is a schematic diagram showing that a photolithography process has been applied on the wafer to etch a portion of the nitride layer to about half of its original thickness, causing the formation of a stepped nitride layer which includes a partially etched and recessed portion and an un-etched portion.

FIG. 2 shows that a photolithography process has been applied on the wafer to etch a portion of the nitride layer to about half of each original thickness, causing the formation of a stepped nitride layer which includes a partially etched and recessed portion and an unetched portion. FIG. 2 also shows that the nitride layer 4 has become a stepped nitride layer having a high thickness region 4a covered nitride photoresist 5 and a low thickness region 4b, not covered by photoresist.

Figure 3:
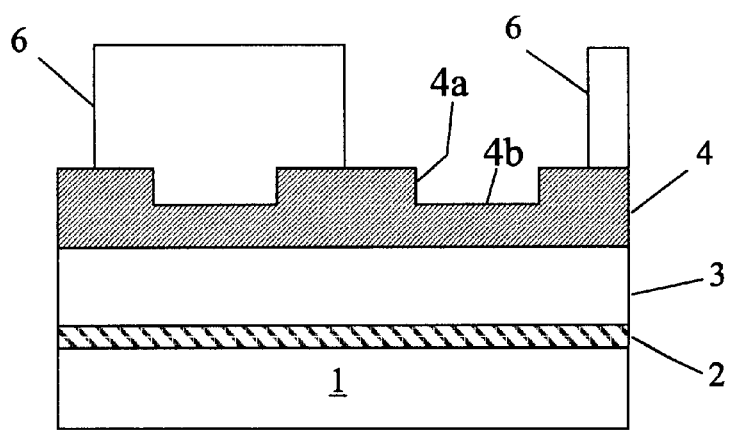
FIG. 3 is a schematic diagram showing that a photoresist is formed on the stepped nitride layer using a poly-1 photomask.

FIG. 3 shows that a poly-1 photoresist 6 is formed on the stepped nitride layer using a poly-1 photomask.

Figure 4:
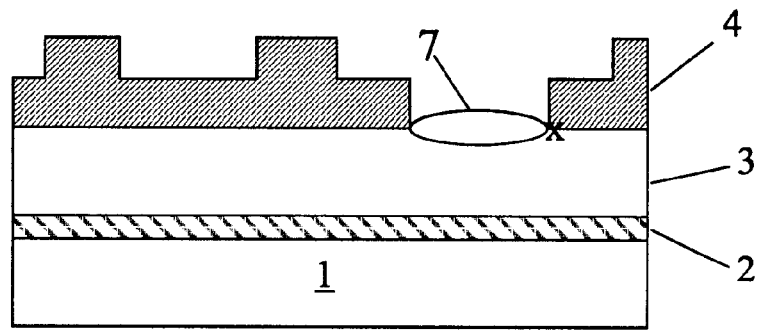
FIG. 4 is a schematic diagram showing that the recessed portion of the nitride not covered by the photoresist is etched through to expose the underlying poly-1 layer, which is then oxidized to form a poly-ox layer.

FIG. 4 shows that, in conjunction with the poly-1 photomask, the low thickness portion of the nitride is etched through to expose the underlying poly-1 layer. At the same time, the high thickness portion of the nitride layer is also etched to a reduced thickness. The high thickness portion of the nitride layer serves as an etch stop during the etching through of the low thickness portion. The exposed poly-1 area is oxidized to form a poly-oxide layer 7, after the removal of the photoresist.

Figure 5:
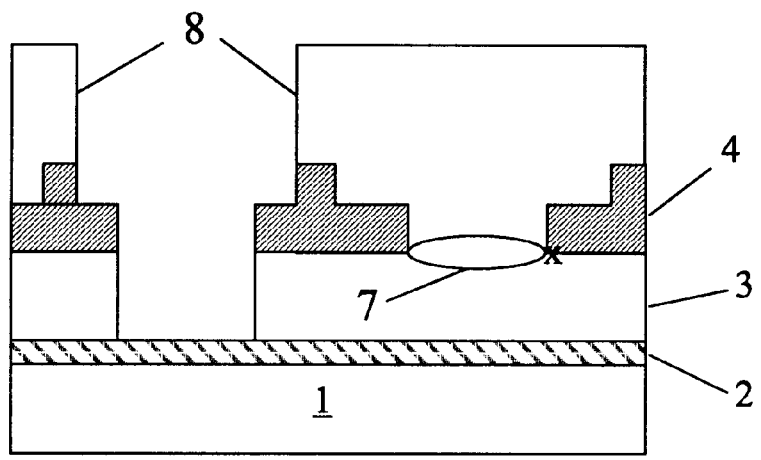
FIG. 5 is a schematic diagram showing that a photoresist is formed on the nitride layer using a cell drain photomask.

FIG. 5 shows in conjunction with a cell drain photomask, a cell drain photoresist 8 is formed to allow the low thickness region not covered by the cell drain photoresist 8 to be etched through using a nitride etch, at the same time, the portion of the high thickness region adjacent to the low thickness region is also etched to a reduced thickness during the nitride etch. After the nitride etch, a poly etch step is performed to etch through the underlying poly-1 layer.

Figure 6:
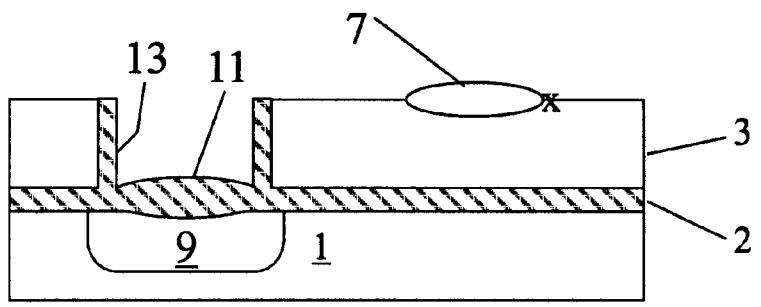
FIG. 6 is a schematic diagram showing drain implantation and removal of the photoresist and the nitride layer.

FIG. 6 shows that a drain region 9 is formed by drain implantation, and that, the nitride layer 4 (by hot $H_3PO_4$ or wet etch) and the cell drain photoresist 8 are subsequently removed. FIG. 6 also shows that a drain oxidation step is performed to increase the thickness of the oxide layer 11 above the drain region, after the removal of the photoresist. If necessary, the sidewall oxide 13 can be removed by wet dip.

Figure 7:
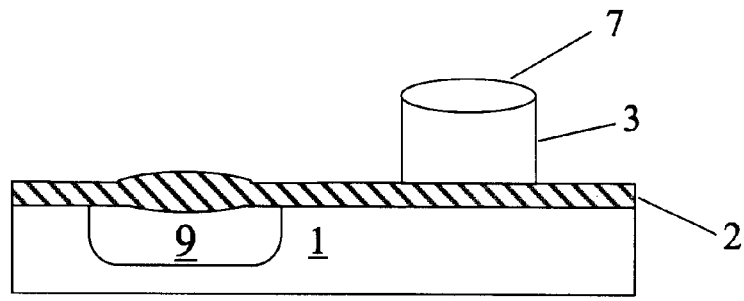
FIG. 7 is a schematic diagram showing the removal of the poly-1 layer, using the poly-oxide layer as a hard mask.

FIG. 7 is a schematic diagram showing the removal of the bulk 8 the poly-1 layer, using the poly-oxide layer 7 as a hard mask. The remaining poly-1 layer will eventually become the floating gate of the non-volatile memory cell. FIG. 7 also shows that a sidewall spacer 20 is formed on the sidewall 21 of the remaining poly-1 layer 3.

Figure 8:
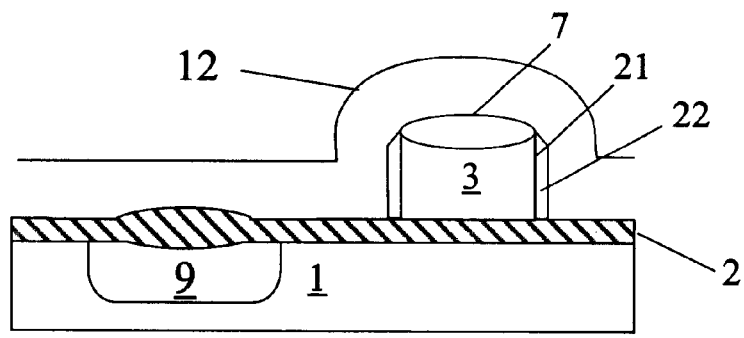
FIG. 8 is a schematic diagram showing the deposition of a poly-2 layer on the wafer.
Figure 9:
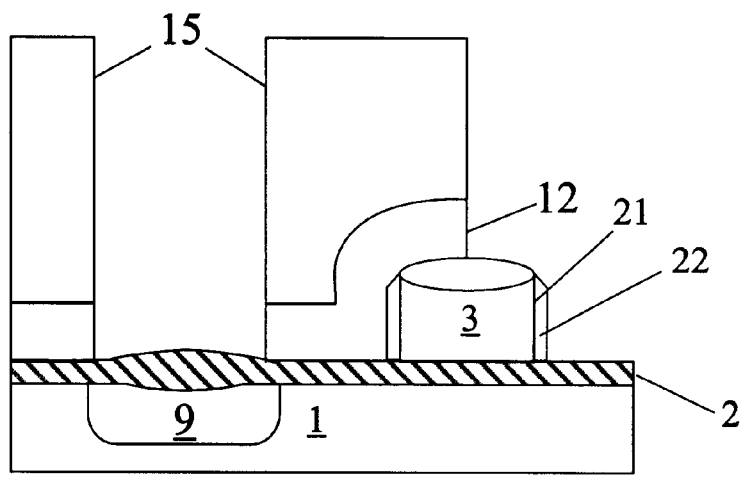
FIG. 9 is a schematic diagram showing a poly-2 photolithography process to form select gate from poly-2.

FIG. 8 is a schematic diagram showing the deposition of a poly-2 layer 12 on the wafer. And FIG. 9 shows that a poly-2 photoresist 15 is utilized to form select gate from poly-2. Preferably, the poly-2 layer, which can be either pure polysilicon or polycide, has a thickness of about 1,000 to 4,000 Å.

Figure 10:
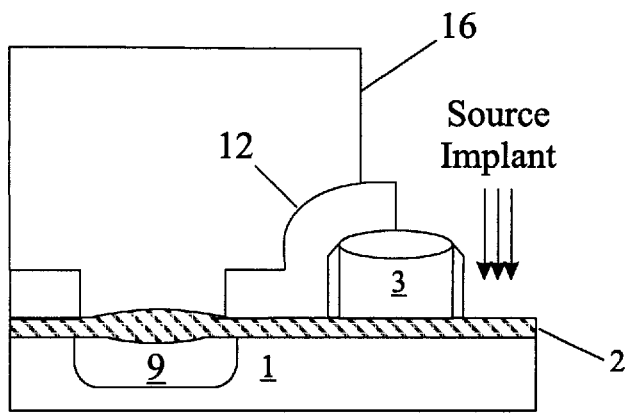
FIG. 10 is a schematic diagram showing a photoresist is formed on the wafer using a cell source photomask, followed by source implantation.

FIG. 10 shows that, after the removal of photoresist 15, a cell source photoresist 16 is formed on the wafer, followed by source implantation.

Figure 11:
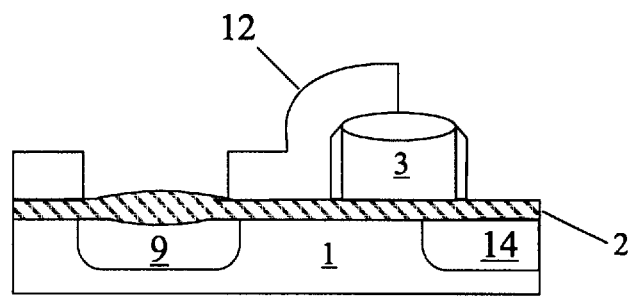
FIG. 11 is a schematic diagram showing the split gate non-volatile memory structure of the present invention.

Finally, FIG. 11 shows the removal of the cell source photoresist.

Figure 12:
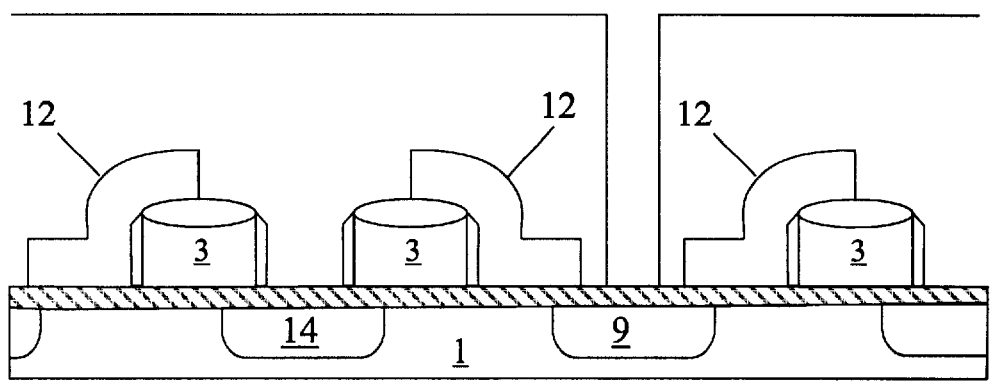
FIG. 12 is a schematic diagram showing a multiplicity of the split gate non-volatile memory structures of the present invention formed on the same wafer.

FIGS. 1–11 show only a single cell. FIG. 12 is a schematic diagram showing a multiplicity of the split gate non-volatile memory structures of the present invention formed on the same wafer.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for making self-aligned split-gate non-volatile memory cell, comprising the steps of:

(a) forming a tunnel oxide layer, a poly-1 layer, and a nitride layer on a silicon substrate;

(b) forming a nitride photoresist and using said nitride photoresist to etch said nitride layer and cause it to become a stepped nitride layer having a high thickness region and a low thickness region, wherein said low thickness region contains a first portion corresponding to an area intended to become floating gate and a second portion corresponding to an area intended to become cell drain;

(c) forming a poly-1 photoresist and using said poly-1 photoresist to etch through said first portion of the low thickness region to expose an underlying poly-1 layer intended to be floating gate, wherein at the same time, a portion of said high thickness region adjacent to said first portion of said low thickness region is also etched to a reduced thickness;

(d) poly-oxidizing said exposed poly-1 layer to form a poly-oxide layer;

(e) forming a cell drain photoresist and using said cell drain photoresist to etch through said second portion of said low thickness region using a nitride etch and an underlying poly-1 layer using a poly etch, wherein a portion of said high thickness region adjacent to said second portion of said low thickness region is also etched to a reduced thickness during said nitride etch;

(f) performing drain implantation to form cell drain, followed by removing said nitride layer;

(g) using the poly-oxide layer as a hard mask to etch said poly-1 layer;

(h) forming a sidewall spacer on the sidewall of said poly-1 layer;

(i) depositing a poly-2 layer covering said substrate;

(j) forming a poly-2 photoresist and using said poly-2 photoresist to etch the poly-2 layer; and (k) forming a cell source photoresist and using said cell source photoresist to perform a cell source implantation.

2. The process for making self-aligned split-gate non-volatile memory cell according to claim 1 wherein said nitride layer comprises $Si_3N_4$.

3. The process for making self-aligned split-gate non-volatile memory cell according to claim 1 wherein said low thickness nitride region has a thickness about half of that of said high thickness nitride region.

4. The process for making self-aligned split-gate non-volatile memory cell according to claim 1 wherein said tunnel oxide layer has a thickness of about 50 to 150 Å.

5. The process for making self-aligned split-gate non-volatile memory cell according to claim 1 wherein said nitride layer has a thickness of about 300 to 3,000 Å.

6. The process for making self-aligned split-gate non-volatile memory cell according to claim 1 wherein said poly-1 layer has a thickness of about 500 to 3,000 Å.

7. The process for making self-aligned split-gate non-volatile memory cell according to claim 1 wherein said poly-2 layer has a thickness of about 1,000 to 3,000 Å.

8. The process for making self-aligned split-gate non-volatile memory cell according to claim 1 wherein said poly-2 layer comprises pure polysilicon or polycide.

9. The process for making self-aligned split-gate non-volatile memory cell according to claim 1 which further comprises a step of drain oxidation after drain implantation to increase the thickness of an oxide layer overlaying said cell drain.

10. The process for making self-aligned split-gate non-volatile memory cell according to claim 1 which further comprises a step of sidewall poly-oxide removal prior to said step (g) to etch said poly-1 layer.

* * * * *